United States Patent [19]
Stork et al.

[11] Patent Number: 5,412,670
[45] Date of Patent: May 2, 1995

[54] N-BIT PARITY NEURAL NETWORK ENCODER

[75] Inventors: David G. Stork, Stanford; James D. Allen, Castro Valley, both of Calif.

[73] Assignees: Ricoh Corporation, Menlo Park, Calif.; Ricoh Company Ltd., Tokyo, Japan

[21] Appl. No.: 983,659

[22] Filed: Nov. 30, 1992

[51] Int. Cl.⁶ .............................................. G06F 11/10
[52] U.S. Cl. .................... 371/49.2; 371/49.3; 364/972.4; 395/21
[58] Field of Search ............... 371/49.2, 49.3, 49.4, 371/49.1, 50.1, 51.1, 48; 364/972, 972.4, 976, 221, 916, 261.2, 267, 947; 395/25, 22, 23, 21

[56] References Cited

U.S. PATENT DOCUMENTS

| | | | |
|---|---|---|---|
| 4,897,811 | 1/1990 | Scofield | 364/900 |
| 4,912,655 | 3/1990 | Wood | 364/513 |
| 4,914,603 | 4/1990 | Wood | 364/916.2 |
| 4,972,187 | 11/1990 | Wecker | 341/95 |
| 5,050,095 | 9/1991 | Samad | 364/513 |
| 5,058,180 | 10/1991 | Khan | 364/274.9 |
| 5,134,396 | 7/1992 | Sirat et al. | 341/51 |
| 5,170,463 | 12/1992 | Fujimoto et al. | 395/11 |
| 5,268,684 | 12/1993 | Allen et al. | 341/75 |
| 5,287,533 | 2/1994 | Kamiya | 395/800 |
| 5,293,453 | 3/1994 | Frazier | 395/22 |

Primary Examiner—Robert W. Beausoliel, Jr.
Assistant Examiner—Dieu-Minh Le
Attorney, Agent, or Firm—Blakely, Sokoloff, Taylor & Zafman

[57] ABSTRACT

A three layer artificial neural network having an N terminal input, a two cell hidden and a single cell output layer generates an output parity signal indicating whether an even or an odd number of binary bits are asserted at the N terminal input. The two hidden layer neural cells have activation functions that cause deviations about a linear response characteristic that allow the classification of a signal representative of the number of asserted input bits into odd and even groups. This network represents a significant reduction in the number of hidden units previously required because of the particular form of activation transfer characteristic used in the two hidden layer neural cells.

9 Claims, 7 Drawing Sheets (a)

(b)

N-BIT PARITY NEURAL NETWORK ENCODER

FIELD OF THE INVENTION

This invention relates to the field of artificial neural networks and more specifically to the implementations of an N-bit parity encoding network.

BACKGROUND OF THE INVENTION

Parity encoders are used in digital communications and digital memory systems for purposes of detecting system errors. An encoder performs an exclusive-or (XOR) operation on a string of bits. If the number of asserted bits is odd, the parity bit is asserted and if otherwise, the parity bit is not asserted. Thus, if a single bit error occurs in the transmission or as a result of storage, the error can be detected by performing the same XOR parity operation on the string of received bits and by comparing the result with the previously generated parity bit. The standard TTL 74180 parity generator/tester chip is an example of a digital logic implementation of such a network.

The problem of implementing an N-bit parity encoder has been studied by Rumelhart, Hinton and Williams, "Learning Internal Representations by Error Propagation," pp. 334–335, Chapter 8. Parallel Distributed Processing: Explorations in the Microstructure of Cognition, MIT Press, 1986. Rumelhart et al. conclude that in a three layer network (input, hidden and output layer) without any direct connection from the input to the output units, that at least N hidden units are required to solve parity with patterns of length N.

FIG. 1 shows the Rumelhart et al. solution. The three level network consists of an N-terminal input, where input terminal 10 is typical, a set of unit weighted synaptic (receptor)input connections, such as connection 16, which connect the input to the hidden layer of N neural cells 12, each neural cell 12 having a threshold value applied on input 22, a total of N synaptic weights connecting the output of the hidden layer cells 12 to the single output layer neural cell 14, each weight having alternately signed unit weights where solid lines signify positive and dotted lines signify negative or inhibitory unit values. The output of hidden cells 12 and output cell 14 is transformed by an appropriate threshold activation function to produce an output of +1 if the sum of the inputs is greater than zero, and zero out if otherwise. Thus, it should be noted that if any k bits out of N are asserted at the input, the sum, $net_m$, of the input bits plus the threshold and the hidden layer input will be $$net_m = k + (1-2\,m)/2 \qquad (1)$$

where $(1-2\,m)/2$ is the threshold bias input 22 of the $m^{th}$ bit. As a result, $$net_m > 0,\ k \leq m \qquad (2)$$
$$net_m < 0,\ k > m$$

so that the output of the first k hidden layer cells 12 will be a logic 1 while the remaining N-k will be at logic level 0. If m is an even number, the sum or value of "net" into output cell 14 will be $-\frac{1}{2}$ causing a zero logic output, otherwise causing a logic 1 level, in accordance with the N-bit parity rule.

The N-bit parity problem is non-linearly separable which cannot be solved by a two level network (input and output level)in which the problem itself indicates the number of input and output terminals. The N-bit parity problem requires a three layer structure. However, for three layer structures, there is no general hard and fast rule as to the number of hidden units required, that can be applied before the training and application of weight (connection) minimization techniques.

A simple three-level neural network with a minimum of hidden units would be useful for neural networks requiring implementation of the N-bit parity function using compatible neural network technology, thus potentially providing simplicity in construction, speed of use, and smaller area utilization on silicon VLSI.

SUMMARY AND OBJECTS OF THE INVENTION

One object of the present invention is to the implementation of N-bit parity network using neural network compatible components.

Another object is to provide a simpler network using less hidden units than the prior art.

Another object is to provide a trainable neural network by using an activation function nonlinearity that is strictly a monotonically increasing function of the input "net" value.

Another object is to use a feedforward neural network with a single hidden layer.

Another object is to have every unit in the hidden layer have identical nonlinear activation transfer characteristics for ease of manufacture.

A three (input, hidden, and out) level N-2-1 neural network having N input terminals and two hidden layer neural cells with identical monotonically increasing transfer characteristics is described that implements the classic N-bit parity problems in which an odd number of asserted input bits produces an asserted output bit. An even number of asserted input bits produces a deasserted output.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
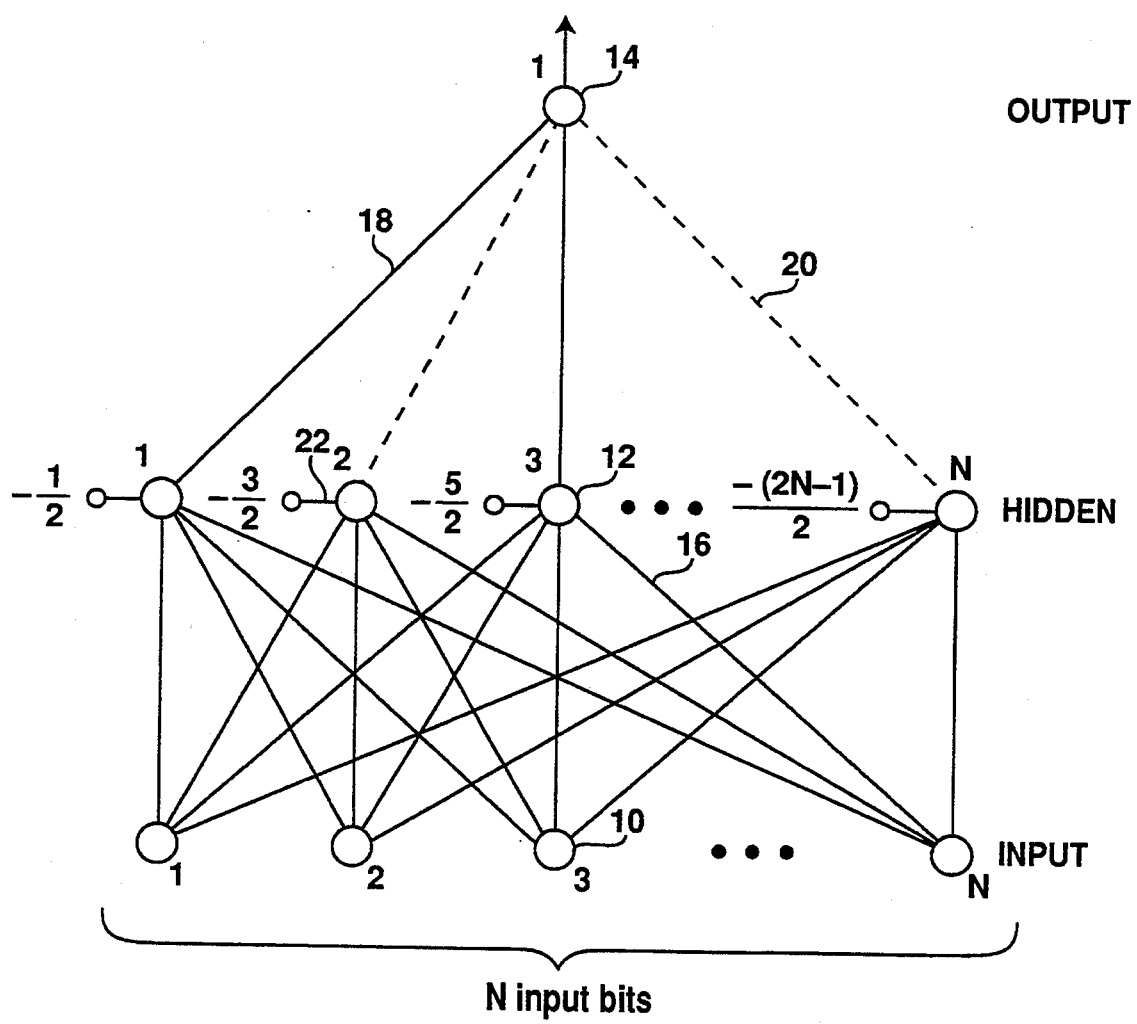
FIG. 1 shows a prior art (Rumelhart et al.) N-bit parity neural network.
Figure 2:
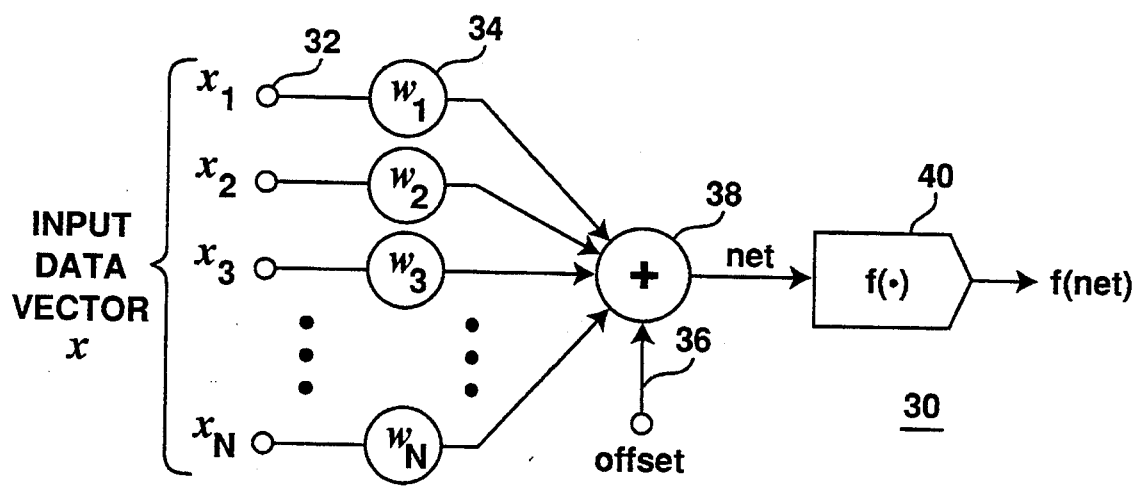
FIG. 2 shows a typical M-P neural cell.

FIG. 2 shows a typical neural network of the McCullogh-Pitts (M-P) type in which data is applied to the N input terminals 32. Weights, 34, labeled $w_1 \ldots w_N$, scale the input value applied to each of the associated input terminals producing, at the output of adder network 38, the vector dot product of the weight vector w and input data vector x $$net = w^T \cdot x = \sum_{i=1}^{N} w_i x_i \qquad (3)$$

Also, an offset may be applied to adder 38 or alternatively, the constant offset signal may be included with the input vector as a constant input scaled by a corresponding element of weight vector, w.

The vector dot product labeled "net" of the output of adder 38 is applied to activation unit 40 typically having a nonlinear input/output transfer characteristics f(·), that yields at its output the value f(net).

The transfer characteristic, f(·), of element 40 typically is a monotonic increasing function of its input that may include the standard sigmoidal function $$f(net) = e^{\alpha \cdot net}/(e^{\alpha \cdot net}+1) \qquad (4)$$

where $\alpha$ has a positive finite value.
As a result, $$f(-\infty) = 0$$

$$f(0) = \frac{1}{2}$$

$$f(\infty) = 1$$

A limiting form of this function is the sign or signum function $$\text{sgn}(net) = \begin{Bmatrix} 1, & net > 0 \\ 0, & net < 0 \end{Bmatrix}$$

also known as a hard limiter function.

Clearly, the network of FIG. 2 has many possible implementations depending on other design consideration such as the type of circuit technology used. For example, analog implementation may use discrete or integrated circuit technology. Similarly a number of viable digital options are also well known in the art. Combinations of both analog and digital techniques are used in commercial offerings of neural network cells and networks.

Figure 3:
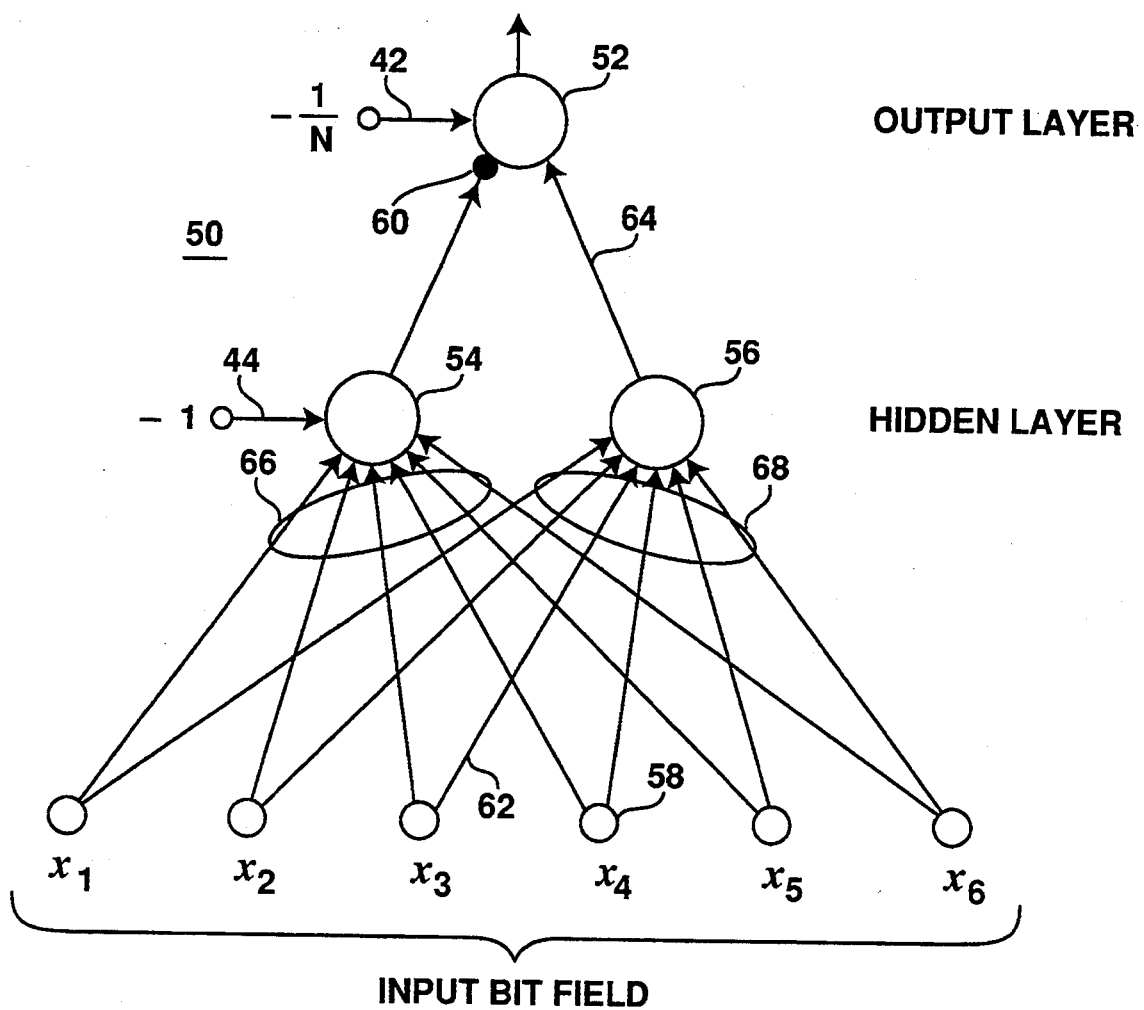
FIG. 3 is a N-2-1 realization of an N-bit parity neural network.

For purposes of explanation, FIG. 3 shows an embodiment of N=6 parity network using an M-P type neural cell at the output level. The transfer characteristic of the hidden units 54 and 56 is given by $$f(net) = \frac{1}{N} (net - \cos(\pi \cdot net)/\alpha\pi) \qquad (5)$$

where net=$w^T$·x+offset, w is the weighting vector 66 or 68 of hidden neural cells 54 and 56 respectively, and x=$[x_1 x_2 \ldots x_L]^T$, the input data vector. The set of input weights 66 and 68 are all equal so that each set may be represented by the vector w=$[1\ 1\ 1\ \ldots\ 1]^T$. Therefore the dot product $w^T x$ is equal to the sum of the number of asserted input bits.

The parameter $\alpha$ is any constant greater than 1. This restriction on $\alpha$ ensures that the transfer characteristic is monotonically increasing function, a necessary constraint for most learning (training) algorithms.

As a result, the value of net applied to neural cell 56 is $$net_{56} = w^T \cdot x = \sum_{i=1}^{6} x_i = n \qquad (6)$$

where n is the number of asserted input bits.

Similarly, the value of net applied to neural cell 54 differs by the offset value of $-1$ so that $$net_{54} = w^T \cdot x + 1 = n - 1 \qquad (7)$$

Consequently, the values of the output of hidden layer cells 54 and 56 are $$f(net_{54}) = \frac{1}{N} (n - 1 + \cos(n\pi)/\alpha\pi) \qquad (8)$$

$$f(net_{56}) = \frac{1}{N} (n - \cos(n\pi)/\alpha\pi)$$

Figure 4:
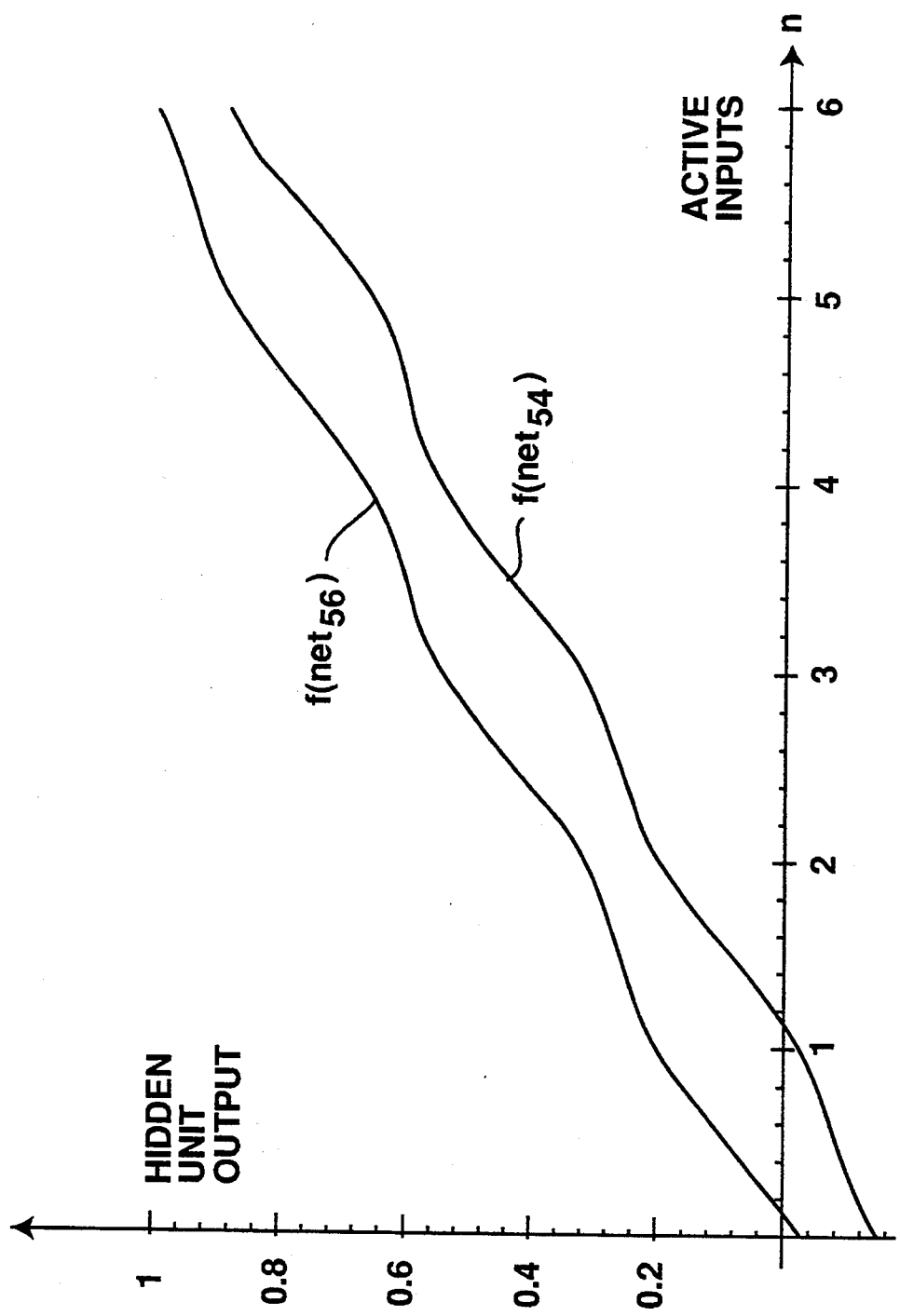
FIG. 4 shows the transfer characteristic of the two hidden layer activation nonlinearities.

FIG. 4 is a plot of equations (8) for the 6-2-1 network of FIG. 3. For clarity, the value is plotted as a continuous function of the number of active inputs, n, even though n is an integer variable. Because the hidden units are connected to the output unit with opposite sign as indicated by dot on receptor 60, and because output neural cell 52 has an offset of $-1/N$, the value of $net_{52}$ is $$net_{52} = f(net_{56}) - f(net_{59}) - \frac{1}{N} \qquad (9)$$

$$net_{52} = f(net_{56}) - f(net_{59}) - \frac{1}{N} = \frac{1}{N}\left(1 - \frac{2}{\alpha\pi}\cos(n\pi)\right) - \frac{1}{N}$$

$$net_{52} = -\frac{2}{\alpha\pi N}\cos(n\pi) = -\frac{2}{\alpha\pi N}(-1)^n$$

Figure 5:
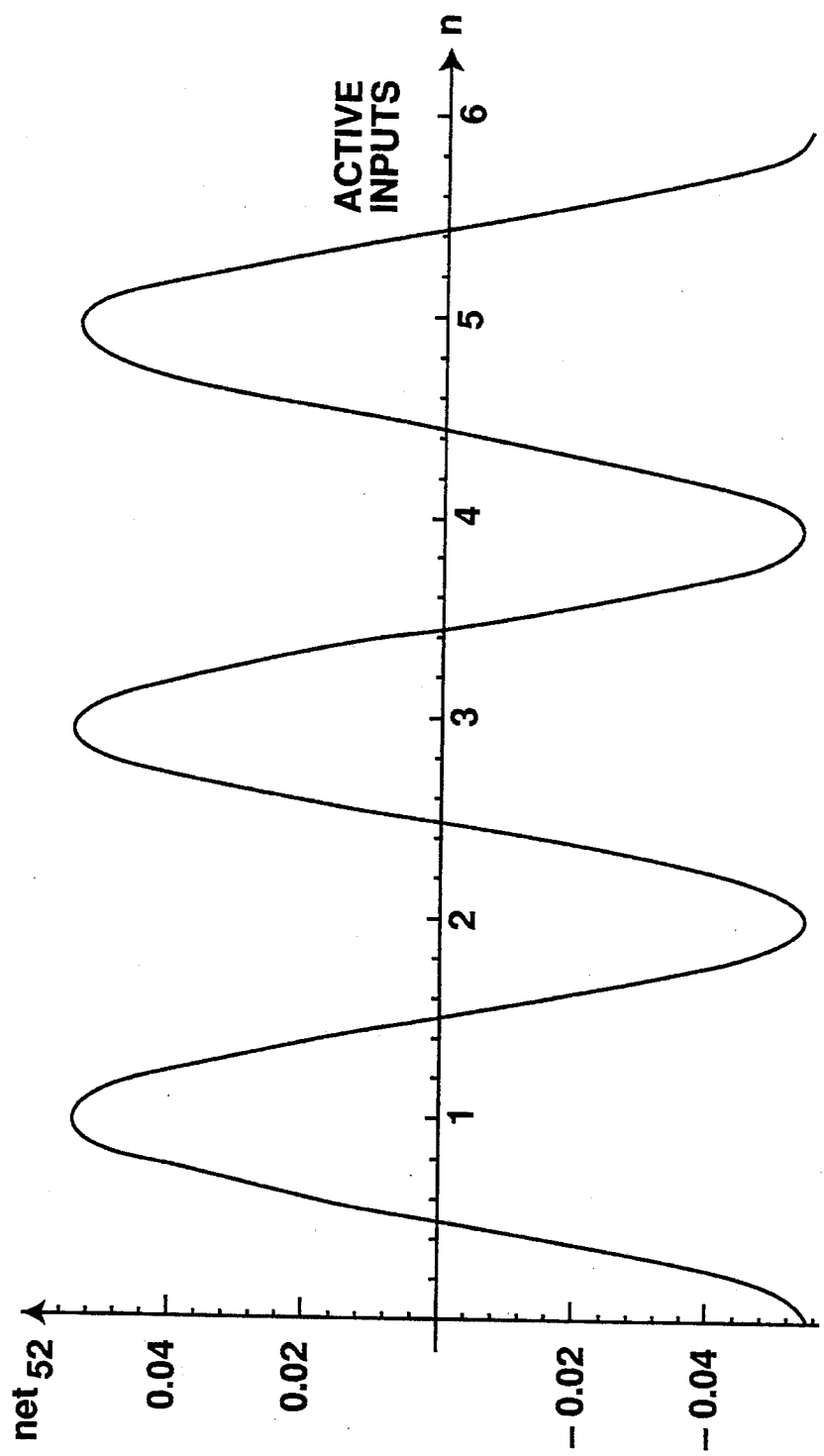
FIG. 5 shows the transfer characteristic of the output level neural cell activation function nonlinearity.

The expression of equation (52) is plotted in FIG. 5. Again, for the sake of clarity, the value of $net_{52}$ is plotted as a continuous real function of number of active inputs.

Other functionally equivalent embodiments will be apparent to those skilled in the art. For example, if the offsets supplied to neuron cells 52 and 54 on lines 42 and 44, respectively, were set to zero, the values of f($net_{54}$) and f($net_{56}$) would be $$f(net_{54}) = \frac{1}{N} [n + \cos(n\pi)/\alpha\pi]$$

and $$f(net_{56}) = \frac{1}{N} [n - \cos(n\pi)/\alpha\pi]$$

so that $$net_{52} = -\frac{2}{\alpha\pi N} \cos \pi n$$

which is identical to equation (9).

Because the output neuron 52 is a linear threshold unit acting on net 52, the output at integer values of n will oscillate between 0 for even values and 1 for odd values producing the desired parity output function.

Figure 6:
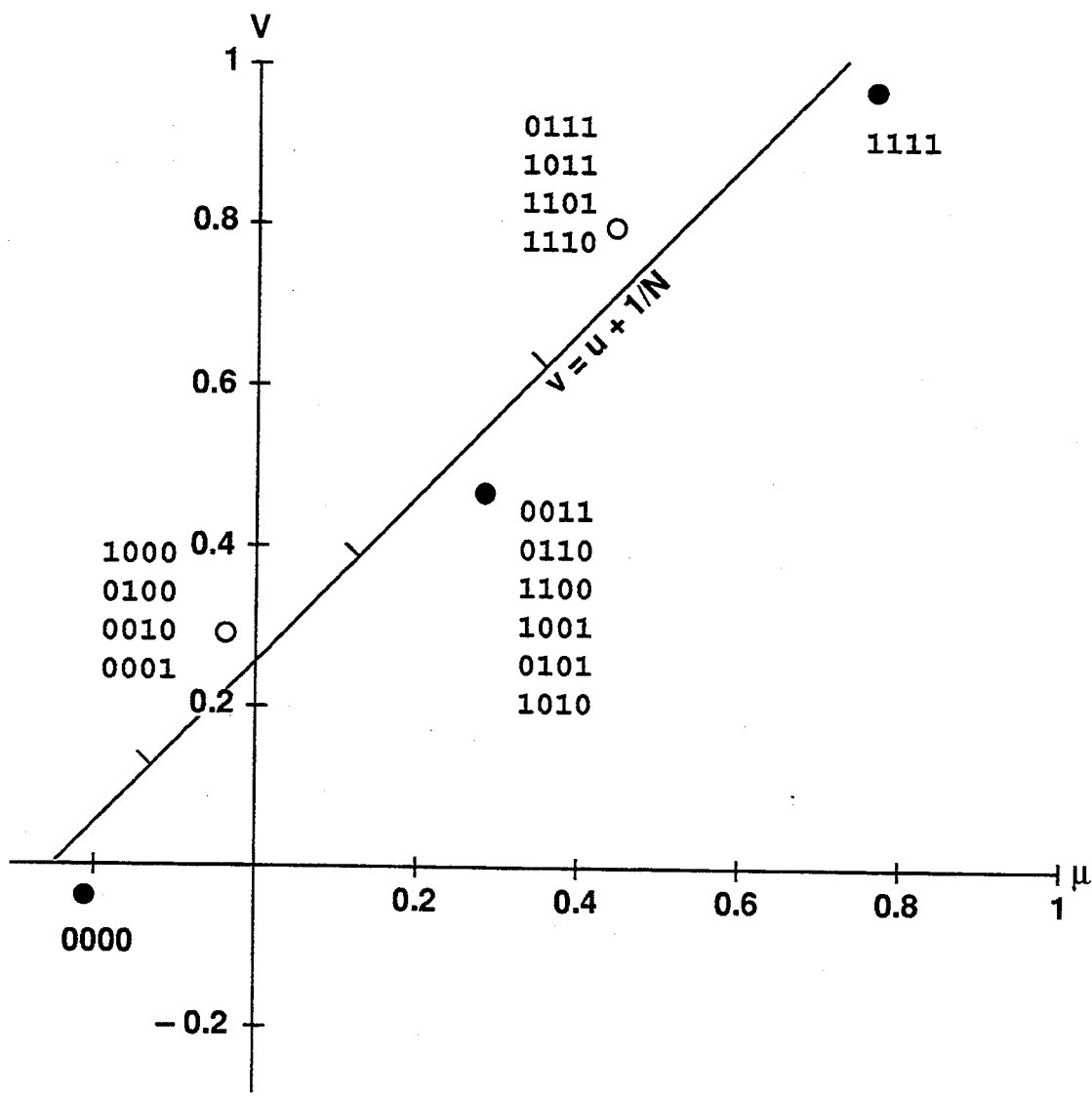
FIG. 6 shows the net activation output value applied to the output neural cell.

In order to further clarify the function of the feedforward parity network described, refer to FIG. 6 which shows the mapping of the input space to the hidden layer output space for an N<4 bit parity problem. The non-traditional transfer characteristic of the hidden units acts to shift the even-parity patterns below, and the odd-parity patterns above the discriminating line $v = u + 1/N$. This is the decision boundary computed by the hidden to output layer.

FIG. 6 shows the net activation, f(net), of the hidden units in 4-2-1 parity network. A total of 16 bit patterns may be represented by the 4-bit input. The blackened discs represent even parity inputs while the white discs represent odd parity inputs. The bit patterns are listed next to their associated dots. The abscissa, u, is the activation value $f(net_{54})$ of the left hidden unit with bias as shown in FIG. 3 while the ordinate, v, represents the $f(net_{56})$ of the hidden cell the right. Because of the particular transfer characteristics described by equations (8), the points may be separated by the line $v = u + \frac{1}{4}$, which is computed at the input to the output cell.

It is important to note that the specific form of activation described by equation (5) is not unique. The term $\cos(\pi \cdot net) = \cos(\pi \cdot n)$ could be replaced by any number of functions, for example $g(\cdot)$, having a similar, but not identical oscillatory nature. In other words it is required that $$g(n) > 0, \text{ for n odd} \qquad (10)$$

$$\text{and } g(n) < 0, \text{ for n even}$$

Figure 7:
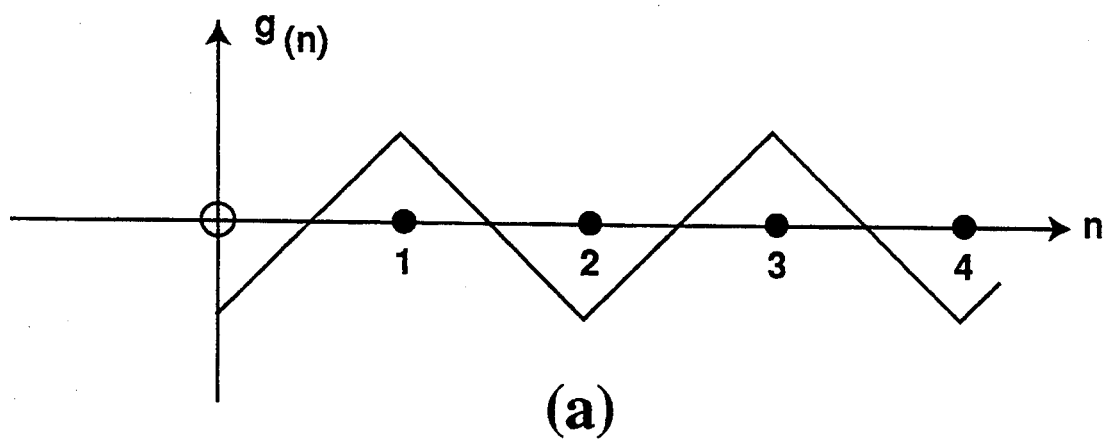
FIG. 7 shows the net activation output values for the hidden units in a 4-2-1 network.
Figure 7:
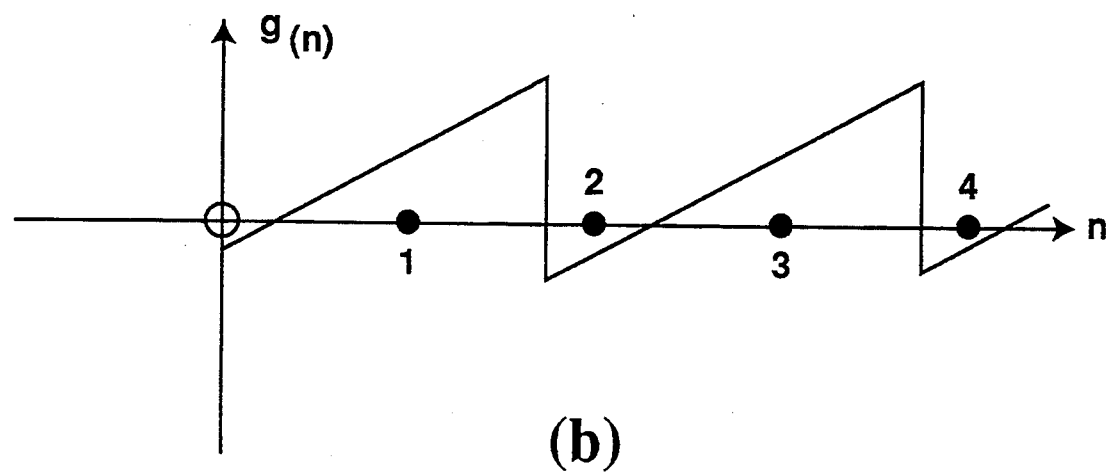

For example, the transfer characteristic for g(n), shown in FIG. 7(a) and (b) would serve the purpose. It is also clear that the function g(n) does not have to be strictly periodic but only that its sign be oscillatory for even and odd values of the argument, n.

Analog methods for implementing nonlinear transfer characteristics are well known in the art. For example, diode arbitrary function generators and polynomial function generators may be used such as described in "Nonlinear Circuitry Handbook", Sheingold, D. G., editor, Analog Devices, Inc., Publisher, Norwood, Mass., 1976, pages 29–64.

If strict monotonocity is also required, the first derivative of the generalized form of equation (5), or equivalently $$f(n) = \frac{1}{N} [n - g(n)] \qquad (11)$$

may require that the first derivative be positive for all values of n. Thus $$\frac{df(n)}{dn} = \frac{1}{N} (1 - g'(n)) > 0$$

or $$g'(n) < 1$$

This constraint on monotonocity may be necessary for training purposes where the activation function, f(n), is used to initialize an untrained network.

Because these and other variations will be apparent from the above description to those practicing the art, the above description and techniques are only intended to be exemplary and limited by the scope of the claims.

Also, in the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is

1. A parity detecting neural network operating on an N-bit input field for providing a binary output signal that indicates if an even or odd number bits in the N-bit input field have been asserted, the neural network comprising:
    (a) a multiplicity of N input terminals, each terminal for accepting a distinct bit from the N-bit input field;
    (b) a hidden layer having a first neural cell and a second neural cell, each neural cell including:
        (i) a set of N equally weighted synapses, each synapse connected to a distinct input terminal for producing a set of weighted output signals,
        (ii) a synaptic summing network for accepting the set of weighted output signals and for forming an output signal with a level proportional to a count of asserted bits in the N-bit input field,
        (iii) a nonlinear activation network with an input connected to the synaptic summing network output signal for producing an output signal that is a sum of a first signal with a signal level proportional to the synaptic summing network output signal for producing an output signal and a second signal that alternates polarity, having a first polarity if the synaptic summing network output signal level is proportional to an odd count of asserted bits and having an opposite second polarity if the synaptic summing network output signal level is proportional to an even count of asserted bits, the second neural cell nonlinear activation network having a second signal that is of opposite polarity to that of the first neural cell nonlinear activation network second signal;
    (c) an output layer having a single neural cell with a first synaptic input and a second synaptic input respectively connected to the first neural cell output signal and the second neural cell output signal for producing a binary output signal with a first state indicating an even count of asserted bits in the N-bit input field and a second state indicating an odd count of asserted bits in the N-bit input field by forming a difference signal representative of a difference between the output signal of the hidden layer first and second neural cell output signal, the binary output signal state being representative of the difference signal polarity.

2. The parity detecting neural network of claim 1 wherein the nonlinear activation network produces an output signal that varies monotonically with respect to the synaptic summing network output signal level.

3. The parity detecting neural network of claim 1 wherein the second signal of the nonlinear activation network output signal of the hidden layer first and second neural cell are of a same form but of opposite polarity.

4. The parity detecting neural network of claim 3 wherein the output layer single neural cell produces the binary output signal by forming a difference signal that is proportional to the difference between the second signal of the nonlinear activation network output signal of the hidden layer first neural cell and second neural cell.

5. A parity detecting neural network operating on an N-bit input field for providing a binary output signal that indicates if an even or odd number bits in the N-bit input field have been asserted, the neural network comprising:
   (a) a multiplicity of N input terminals, each terminal for accepting a distinct bit from the N-bit input field;
   (b) a hidden layer having a first neural cell and a second neural cell, each neural cell including,
      (i) a set of N equally weighted synapses, each synapse connected to a distinct input terminal for producing a set of weighted output signal,
      (ii) a synaptic summing network for accepting the set of weighted output signals and for forming an output signal with a level proportional to a count of asserted bits in the N-bit input field,
      (iii) a nonlinear activation network with an input connected to the synaptic summing network output signal having a monotonically rising transfer characteristic with oscillating variations having a period corresponding to changes in input signal level representing changes in the count of asserted bits in the N-bit input field of two bits for producing an output signal that is indicative of whether the count of asserted bits in the N-bit input field is odd or even, both the first and second neural cell transfer characteristics having oscillating variations of the same period but of opposite polarity;
   (c) an output layer having a single neural cell with a first synaptic input and a second synaptic input respectively connected to the first neural cell output-signal and the second neural cell output signal for producing a binary output signal with a first state indicating an even count of asserted bits in the N-bit input field and a second state indicating an odd count of asserted bits in the N-bit input field by forming a difference signal representative of a difference between the output signal of the hidden layer first and second neural cell output signal, the binary output signal state being representative of the difference signal polarity.

6. The parity detecting neural network of claim 5 wherein the second signal of the nonlinear activation network output signal of the hidden layer first and second neural cell are of a same form but of opposite polarity.

7. The parity detecting neural network of claim 6 wherein the output layer single neural cell produces the binary output signal by forming a difference signal that is proportional to the difference between the second signal of the nonlinear activation network output signal of the hidden layer first neural cell and second neural cell.

8. A parity detecting neural network operating on an N-bit input field for providing a binary output signal that indicates if an even or odd number bits in the N-bit input field have been asserted, the neural network comprising:
   (a) a multiplicity of N input terminals, each terminal for accepting a distinct bit from the N-bit input field;
   (b) a hidden layer having a first neural cell and a second neural cell, the first neural cell including,
      (i) a set of N equally weighted synapses, each synapse connected to a distinct input terminal for producing a set of weighted output signal,
      (ii) a synaptic summing network for accepting the set of weighted output signals and for forming an output signal with a level proportional to a count of asserted bits in the N-bit input field,
      (iii) a nonlinear activation network with an input connected to the synaptic summing network output signal for producing an output signal that is a sum of a first signal with a signal level proportional to the synaptic summing network output signal for producing an output signal that is a sum of a first signal with a signal level proportional to the synaptic summing network output signal and a second signal that alternates polarity, having a first polarity if the synaptic summing network output signal level is proportional to an even count of asserted bits and having an opposite second polarity if the synaptic summing network output signal level is proportional to an even count of asserted bits, the second neural cell including:
         (i) a set of N equally weighted synapses, each synapse connected to a distinct input terminal for producing a set of weighted output signal, and
         (ii) a synaptic summing network for accepting the set of weighted output signals and for forming an output signal with a level proportional to a count of asserted bits in the N-bit input field,
   (c) an output layer having a single neural cell with a first synaptic input and a second synaptic input respectively connected to the first neural cell output signal and the second neural cell output signal for producing a binary output signal with a first state indicating an even count of asserted bits in the N-bit input field and a second state indicating an odd count of asserted bits in the N-bit input field by forming a difference signal representative of a difference between the output signal of the hidden layer first and second neural cell output signal, the binary output signal states representative of the polarities of the difference signal.

9. The parity detecting neural network of claim 8 wherein the nonlinear activation network produces an output signal that varies monotonically with respect to the synaptic summing network output signal level.

* * * * *